BISTABLE BIASING OF TUNNEL DIODES

Filed May 31, 1962

INVENTOR
WILLIAM G. CROUSE

BY John C Black
ATTORNEY 3,193,703

BISTABLE BIASING OF TUNNEL DIODES

William G. Crouse, Endwell, N.Y., assignor to International Business Machines Corporation, New York, N.Y., a corporation of New York Filed May 31, 1962, Ser. No. 198,982
12 Claims. (Cl. 307—88.5)

This application relates generally to improvements in tunnel diode circuits and more particularly to an improved means for bistable biasing of a tunnel diode.

In the usual tunnel diode circuit, a resistor is connected in series with the tunnel diode and return to a bias voltage so that the load line intersects the positive resistance regions of the diode at currents near the peak and valley of the diode voltage-current characteristic curve. The closer these stable operating points are to the peak and valley of the characteristic curve, the less is the signal current required to drive the tunnel diode over the peak or valley to the other stable state. This method of biasing the tunnel diode has a serious drawback in that the tolerances of the bias voltage and the resistance make it difficult to maintain the bias close to the peak and valley points. Therefore, in order to assure more reliable operation of the circuit, it is necessary to arrange the load line so that it intersects the positive resistance regions of the diode at points further removed from the peak and valley whereby a greater input current is required for switching the transistor from one state to the other.

It is therefore a primary object of the present invention to provide an improved bias means for operating a tunnel diode device as close as possible to the peak and valley of the diode characteristic curve whereby minimum drive currents may be utilized for switching the diode.

It is another object to provide an improved bistable tunnel diode circuit.

It is another object to provide an improved tunnel diode signal translating device.

In one preferred embodiment, these objects are achieved by providing a bias means characterized by a load line having substantially constant current values at the points where it intersects each of the positive resistance regions of the diode characteristic curve and an intermediate nonlinear portion. This means includes a first source of bias potential, which is high relative to the high voltage state of the tunnel diode, connected to one terminal of the tunnel diode through a first large resistor and connected to a second source of bias potential, which is high relative to the high voltage state of the diode, by way of a germanium diode and a second large resistor connected in series. The common junction between the latter resistor and diode is connected to ground through a second germanium diode and a third source of bias potential. The third source of bias potential is substantially equal to the voltage drop across the second diode in its high conduction state.

The voltage drops across each of the germanium diodes in its conductive state is equal substantially to one half of the voltage drop across the tunnel diode in its high voltage state. In the low voltage state of the tunnel diode, the first germanium diode is nonconductive and the second germanium diode is conductive, whereby the bias current for the tunnel diode is supplied solely by the first-mentioned source of bias potential through the first resistor. In the high voltage state of the tunnel diode, the second germanium diode is cut off and the first germanium diode is conducting, whereby the bias current for the tunnel diode equals the current supplied from the first source of supply through the first resistor minus the current flowing through the first germanium diode and the second resistor to the second source of supply. Since high bias voltage supplies and high value resistances are used in the biasing circuit, the tolerances on the bias supplies and the resistances can be substantially relaxed yet the bias currents can be fixed very close to the peak and valley of the tunnel diode characteristic curve.

The foregoing and other objects, features and advantages of the invention will be apparent from the following more particular description of preferred embodiments of the invention, as illustrated in the accompanying drawings.

Figure 1:
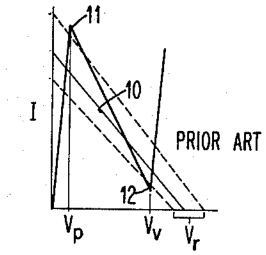
FIG. 1 illustrates the tunnel diode characteristic curve and a load line of the typical prior art bistable device.

It can be seen with respect to the graph of FIG. 1 that the prior art linear load line 10 must be arranged such that it is set far enough away from the peak 11 and the valley 12 of the tunnel diode characteristic curve so that variations in the load line due to the tolerances on $V_r$ and R, the bias potential and the resistance, so that reliable bistable operation is assured. This in turn results in the requirement for higher driving currents to set and reset the bistable device, the more critical of the two being the set signal which switches the diode from its low voltage, high current condition to the high voltage low current condition.

Figure 2:
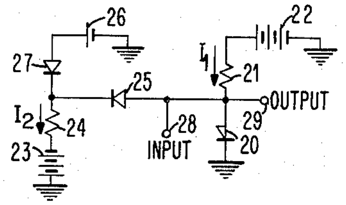
FIG. 2 is a schematic diagram of a preferred embodiment of the improved bistable biasing means of the present invention.

The preferred embodiment of the improved bistable bias means shown in FIG. 2 permits the load line to intersect the positive regions of the diode characteristic curve close to the peak and valley without requiring other than normal tolerances on the bias voltage supplies and the bias resistors.

This bias means includes a tunnel diode 20 and a resistor 21 connected in series to a source of bias potential 22. A second source of bias potential 23 is connected to the common connection between the tunnel diode and the resistor by way of a second bias resistor 24 and a diode 25. A third source of potential 26 is connected to the common junction between the resistor 24 and the diode 25 by way of a second diode 27. Input signals for switching the tunnel diode from one state to the other are applied to the input terminal 28 and output signals are taken from the terminal 29.

Figure 3:
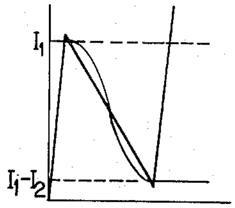
FIG. 3 illustrates the tunnel diode characteristic and the load line for the bistable circuit of FIG. 2.

The voltage drop across a typical tunnel diode in its low voltage state is close to zero volts (e.g. .05 v.); and a typical value of the voltage drop across the tunnel diode in its high voltage state is about .4 volt positive. The values of the bias supply potentials are made high relative to the high voltage drop across the tunnel diode, for example in excess of 10 to 1. By way of example, it may be assumed that each of the sources 22 and 23 are 12 volt supplies. The resistors 21 and 24 may therefore be made relatively large, for example, 7,500 ohms and 10,000 ohms, respectively, to provide a low voltage bias current $I_1$ (FIG. 3) of approximately 1.6 milliamperes and a high voltage bias current $I_1-I_2$ of approximately .33 milliampere.

The diodes 25 and 27 are low voltage drop diodes, for example, germanium diodes, which in their high conducting, forward-biased condition provide a voltage drop of approximately .2 volt, that is, one half of the voltage drop across the tunnel diode in its high voltage state. The source of potential 26 is made approximately equal to the voltage drop across the diode 27 in its forward-biased high conducting state.

Assume first that the tunnel diode is in its low voltage state whereby the potential at its anode is approximately +.05 v. This .05 v. positive voltage is applied to the anode of the diode 25. The positive .2 volt potential applied to the anode of the diode 27 by the potential source 26 will forward bias the diode 27, whereby approximately zero volt potential will appear at its cathode. The potential difference across the diode 25 will not be sufficient to forward bias it to its high conductivity state, and therefore the diode 25 will present a high impedance. As a result, all of the current $I_2$ will be flowing through the diode 27; and current $I_1$ flows through the tunnel diode. The horizontal load line of $I_1$ makes it possible to set the bias current $I_1$ very near the peak of the tunnel diode characteristic curve.

Assume that the tunnel diode is in its high voltage state whereby the anodes of the diodes 20 and 25 will be at approximately +.4 volt. This .4 volt potential is sufficient to forward bias the diode 25 whereby a positive .2 volt potential will appear at the cathodes of the diodes 25 and 27. The diode 27 accordingly assumes its high resistance condition, and all of the current $I_2$ will flow through the diode 25. This results in a high resistance source biasing for the tunnel diode at a bias current of $I_1-I_2$ which can be held very close to the valley of the tunnel diode characteristic curve due to the horizontal positioning of the load line of the current $I_1-I_2$. The nonlinear portion of the load line curve between the current conditions $I_1$ and $I_1-I_2$ is the result of the transition first of the diode 25 from its high impedance, low conductivity state to its low impedance, high conductivity state and then the transition of the diode 27 from its low impedance, high conductivity state to its high impedance, low conductivity state. At either end of the transition state, the characteristics of the diodes are relatively constant providing the horizontal positioning of the load line at these portions.

Figure 4:
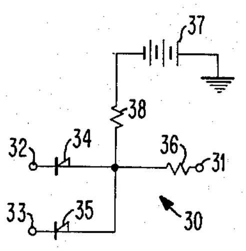
FIGS. 4 and 5 are schematic diagrams of input circuits for the circuit of FIG. 2 to operate the latter as a signal translating device and a bistable device respectively.

A logic OR circuit 30, shown by way of example in FIG. 4, includes an output terminal 31 adapted for connection with the input terminal 28, FIG. 2, for utilizing the circuit of FIG. 2 as a signal translating or amplifying device.

The circuit 30 has a pair of input terminals 32 and 33 connected to the cathodes of respective diodes 34. Preferably these diodes are of the well known backward or reverse type which are similar to conventional tunnel diodes except that they are specially formed so as to eliminate their negative resistance characteristics. They exhibit high impedance when forward biased and very low impedance when reverse biased. In the reverse bias condition, they have very small voltage drops, e.g. .05 v.

The anodes of the diodes 34 and 35 are connected to the output terminal 31 by way of a resistor 36 and to a source of bias potential 37 by way of a resistor 38. The input signals may vary from +.4 volt to zero volts. With a positive potential applied to either input terminal 32 or 33, the tunnel diode 20 will assume its high voltage state; and, with negative potentials applied to both input terminals, the diode 20 will assume its low voltage state.

Figure 5:
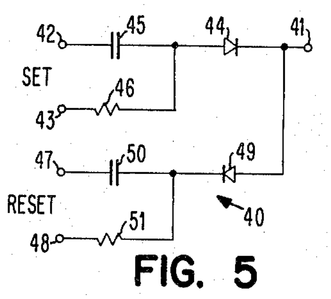

A set and reset gating circuit 40, shown by way of example in FIG. 5, includes an output terminal 41 adapted for connection with the input terminal 28, FIG. 2, for utilizing the circuit of FIG. 2 as a bistable device.

The circuit 40 has a pair of set terminals 42 and 43 connected to the anode of a low voltage drop diode 44, for example a silicon diode, by way of a capacitor 45 and a resistor 46 respectively.

The circuit 40 also has a pair of reset terminals 47 and 48 connected to the anode of low voltage drop diode 49 by way of a capacitor 50 and a resistor 51, respectively.

To set the tunnel diode 20 in its high voltage state a positive .4 voltage potential is applied to the terminal 43 to charge the capacitor 45. A positive .4 volt pulse is then applied to the terminal 42 producing a voltage rising toward +.8 volt at the anode of diode 44. This forward biases the diode 44 and sets the tunnel diode 20 in its high voltage state.

Similarly, a negative .4 volt potential applied to the terminal 48 and then a negative .4 volt pulse applied to the terminal 47 will forward bias the diode 49 to reset the tunnel diode 20 to its low voltage state.

It will be readily understood that the circuit of FIG. 2 may be used in other well known ways.

Figure 6:
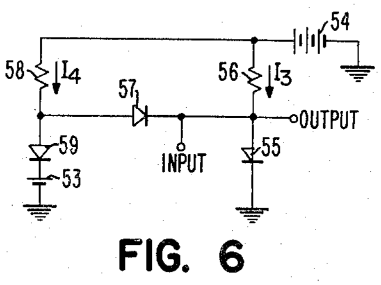
FIG. 6 is a schematic diagram of a second embodiment of the improved bistable biasing means.

In the embodiment of FIG. 6, a tunnel diode 55 has its cathode connected to ground potential and its anode to a source of +12 volt potential 54 by way of a load resistor 56. The anode is also connected to the positive potential source by way of a germanium diode 57 and a resistor 58. A second germanium diode 59 is connected between the diode 57 and a +.2 volt potential source 53.

When the tunnel diode 55 is in its high voltage state, it applies a +.4 volt potential to the cathode of diode 57; and diode 59 applies a +.4 volt potential to the anode of diode 57, rendering the latter substantially nonconductive. The current $I_2$ (which is the equivalent of $I_1-I_2$ of FIG. 3) flows through the tunnel diode, and current $I_4$ flows through the diode 59.

When the tunnel diode 55 is in its low voltage state, it applies a zero volt potential to the cathode of diode 57. Diode 59 is rendered nonconductive and diode 57 conductive. Currents $I_3$ and $I_4$ (which are the equivalent of $I_1$ of FIG. 3) flow through the tunnel diode.

The values given for the various components and for the differing bias currents are given by way of example, and it will be appreciated that it is well within the skill of those working in the art to modify the values in accordance with the particular characteristics of the tunnel diode utilized and the desired operating conditions including the levels of the input and output signals.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An electrical circuit comprising
a tunnel diode having low and high voltage states,
first means including a first resistor connected to the diode for supplying a bias current of one predetermined value to the diode,
second means including the first resistor, a semiconductor element and a second resistor connected in series for supplying a bias current of a predetermined lower value to the diode, and
means including a semiconductor element connected to the junction between the first-mentioned semiconductor and the second resistor for rendering the first means and the second means effective when the diode is in its low and high voltage states respectively.

2. An electrical circuit comprising
a tunnel diode having low and high voltage states,
first means including a first resistor connected to the diode for supplying a bias current of one predetermined value to the diode,
second means including the first resistor, a semiconductor element having a voltage drop in its high conducting state equal substantially to one-half the voltage drop of the diode in its high voltage state and a second resistor connected in series for supplying a bias current of a predetermined lower value to the diode, and
means including a semiconductor element having a voltage drop in its high conducting state equal substantially to one half of the voltage drop of the diode in its high voltage state connected to the junction between the first-mentioned semiconductor and the second resistor for rendering the first means and the second means effective when the diode is in its low and high voltage states respectively.

3. An electrical circuit comprising a tunnel diode having a low state and a high voltage state with a give voltage drop, first means including a first resistor connected to the diode for supplying a bias current of one predetermined value to the diode, second means including a first resistor, the semiconductor element having a voltage drop in its high conducting state equal substantially to one half said diode voltage drop and a second resistor connected in series for supplying a bias current of a predetermined lower value to the diode, and means including a second semiconductor element having a voltage drop in its high conducting state equal substantially to one half said diode voltage drop connected to the junction between the first-mentioned semiconductor and the second resistor for and including a source of bias potential substantially equal to the latter semiconductor voltage drop connected to the second semiconductor element for rendering the first means and the second means effective when the diode is in its low and high voltage states respectively.

4. A signal translating device comprising a tunnel diode having low and high voltage states, first means including a first resistor connected to the diode for supplying a bias current of one predetermined value to the diode, second means including the first resistor, a semiconductor element and a second resistor connected in series for supplying a bias current of a predetermined lower value to the diode, means including a semiconductor element connected to the junction between the first-mentioned semiconductor and the second resistor for rendering the first means and the second means effective when the diode is in its low and high voltage states respectively, and an input circuit connected to the tunnel diode and adapted to receive signals for switching the diode from each voltage state to the other.

5. The signal translating device called for in claim 4 in which the input circuit includes a plurality of backward diodes each adapted to receive input signals, a bias circuit for the backward diodes, and impedance means coupling the latter bias circuit and the backward diodes to the tunnel diode.

6. A bistable device comprising a tunnel diode having low and high voltage states, first means including a first resistor connected to the diode for supplying a bias current of one predetermined value to the diode, second means including the first resistor, a semiconductor element and a second resistor connected in series for supplying a bias current of a predetermined lower value to the diode, means including a semiconductor element connected to the junction between the first-mentioned semiconductor and the second resistor for rendering the first means and the second means effective when the diode is in its low and high voltage states respectively, and first and second gated input circuits each connected to the tunnel diode for switching the diode from its low to its high voltage states and from its high to its low voltage states respectively.

7. Means for biasing a tunnel diode having a pair of terminals in a low voltage, high current state and in a high voltage, low current state comprising a first source of bias potential substantially greater than the voltage drop across the diode in its high voltage stage, a first resistor connected to one terminal of the diode and to the first source, a second source of bias potential of opposite polarity to the first source and substantially greater than the voltage drop across the diode in its high voltage state, a second resistor having a pair of terminals one of which is connected to the second source, a first semiconductor element having a pair of electrodes, one electrode being connected to the other terminal of the second resistor, a source of voltage substantially equal to the voltage drop across the element in its high conducting state and connected to the other electrode of the first semiconductor element, and a second semiconductor element connected to the other terminal of the second resistor and to the one terminal of the tunnel diode, each semiconductor element having a voltage drop in its high conducting state substantially equal to one half the voltage drop across the tunnel diode in its high voltage state for causing high conduction by the first semiconductor element only while the diode is in its low voltage state and high conduction by the second semiconductor element only while the diode is in its high voltage state.

8. A signal translating device comprising a tunnel diode having a pair of terminals and having a low voltage, high current state and a high voltage, low current state, an input circuit connected to the tunnel diode and adapted to receive signals for switching the diode from each state to the other, a first source of bias potential substantially greater than the voltage drop across the diode in its high voltage state, a first resistor connected to one terminal of the diode and to the first source, a second source of bias potential of opposite polarity to the first source and substantially greater than the voltage drop across the diode in its high voltage state, a second resistor having a pair of terminals one of which is connected to the second source, a first semiconductor element having a pair of electrodes, one electrode being connected to the other terminal of the second resistor, a source of voltage substantially equal to the voltage drop across the element in its high conducting state and connected to the other electrode of the first semiconductor element, and a second semiconductor element connected to the other terminal of the second resistor and to the one terminal of the tunnel diode, each semiconductor element having a voltage drop in its high conducting state substantially equal to one half the voltage drop across the tunnel diode in its high voltage state for causing high conduction by the first semiconductor element only while the diode is in its low voltage state and high conduction by the second semiconductor element only while the diode is in its high voltage state.

9. A bistable device comprising a tunnel diode having a pair of terminals and having a low voltage, high current state and a high voltage, low current state, first and second gated input circuits each connected to the tunnel diode for switching the diode from its low to its high voltage state and from its high to its low voltage state respectively, a first source of bias potential substantially greater than the voltage drop across the diode in its high voltage state, a first resistor connected to one terminal of the diode and to the first source,
a second source of bias potential of opposite polarity to the first source and substantially greater than the voltage drop across the diode in its high voltage state,
a second resistor having a pair of terminals one of which is connected to the second source,
a first semiconductor element having a pair of electrodes, one electrode being connected to the other terminal of the second resistor,
a source of voltage substantially equal to the voltage drop across the element in its high conducting state and connected to the other electrode of the first semiconductor element, and
a second semiconductor element connected to the other terminal of the second resistor and to the one terminal of the tunnel diode, each semiconductor element having a voltage drop in its high conducting state substantially equal to one half the voltage drop across the tunnel diode in its high voltage state for causing high conduction by the first semiconductor element only while the diode is in its low voltage state and high conduction by the second semiconductor element only while the diode is in its high voltage state.

10. An electrical circuit comprising
a tunnel diode having low and high voltage states,
a source of bias potential,
a first resistor having a first terminal connected to the source of bias potential and a second terminal connected to the diode,
another source of bias potential,
a second resistor having first and second terminals, one of the latter terminals being connected to the other source of bias potential,
a semiconductor element connecting the other terminal of the second resistor to the junction of the first resistor and the diode,
means effective when the diode is in the one and the other of its states for rendering the semiconductor conductive and nonconductive respectively to supply first and second bias currents to the diode to maintain the latter in its one and other states respectively.

11. The combination set forth in claim 10 wherein
said means includes a second semiconductor element with one terminal connected to the other terminal of the second resistor, and
a bias potential substantially equal to the voltage drop across the second semiconductor element in its high conducting state connected to another terminal of the second semiconductor element, and wherein
each semiconductor element has a voltage drop in its high conducting state substantially equal to one half of the voltage drop across the diode in its high voltage state.

12. An electrical circuit comprising
a tunnel diode having low and high voltage states,
first means including a first resistor connected to the diode for supplying a bias current of one predetermined value to the diode,
second means including a second resistor and a semiconductor element connecting the second resistor to the diode for supplying an additional bias current to the diode, and
means including a second semiconductor element connected to the junction between the first-mentioned semiconductor and the second resistor for rendering the first means and both means effective when the diode is in its high and low voltage states respectively.

References Cited by the Examiner

UNITED STATES PATENTS 3,061,743 10/62 Fukui et al. ----------- 307—88.5

OTHER REFERENCES

Spiegel: Basic Digital Applications of . . . Tunnel Diodes, Application Lab. Report 681, Philco Corporation, December 1960.

JOHN W. HUCKERT, *Primary Examiner.*

ARTHUR GAUSS, *Examiner.*